US012575299B2

(12) United States Patent
Tang et al.

(10) Patent No.:    US 12,575,299 B2
(45) Date of Patent:        Mar. 10, 2026

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Jialiang Tang, Hubei (CN); Wei Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 468 days.

(21) Appl. No.: 18/043,404

(22) PCT Filed: Feb. 15, 2023

(86) PCT No.: PCT/CN2023/076148
§ 371 (c)(1),
(2) Date: Feb. 28, 2023

(87) PCT Pub. No.: WO2024/007589
PCT Pub. Date: Jan. 11, 2024

(65) Prior Publication Data
US 2024/0298504 A1      Sep. 5, 2024

(30) Foreign Application Priority Data
Jul. 8, 2022    (CN) .......................... 202210806079.1

(51) Int. Cl.
*H10K 59/80*        (2023.01)
*H01L 25/18*        (2023.01)
(Continued)

(52) U.S. Cl.
CPC ........... *H10K 59/873* (2023.02); *H01L 25/18* (2013.01); *H10K 59/90* (2023.02); *H10K 2102/311* (2023.02)

(58) Field of Classification Search
CPC ................. H10K 59/873; H10K 59/90; H10K 2102/311; H10K 50/844; H10K 59/00;
(Continued)

(56) References Cited

U.S. PATENT DOCUMENTS

2022/0302405 A1*   9/2022   Choi ...................... H10K 59/38
2022/0392979 A1*  12/2022   Lee ......................... H01L 24/06

FOREIGN PATENT DOCUMENTS

CN        110515499  A      11/2019
CN        111653213  A       9/2020
(Continued)

OTHER PUBLICATIONS

International Search Report in International application No. PCT/CN2023/076148,mailed on Apr. 28, 2023.
(Continued)

*Primary Examiner* — Kevin Quarterman
(74) *Attorney, Agent, or Firm* — PV IP PC; Peter Stecher; Wei Te Chung

(57)            ABSTRACT
A display module and a display device are provided. The display module includes a display panel and a protection layer, the protection layer is arranged on the display panel, the protection layer includes a first protection portion and a second protection portion, and the first protection portion covers a bending region, the second protection portion covers the display region and/or the binding region, and the first protection portion is formed by the second protection portion extending to the bending region. The first protection portion in the present application is configured to replace a UV glue in the prior art, and can be formed by a same process as the second protection portion.

16 Claims, 4 Drawing Sheets

(51) Int. Cl.
    *H10K 59/90*        (2023.01)
    *H10K 102/00*        (2023.01)

(58) Field of Classification Search
    CPC ...... H10K 59/131; H10K 59/38; H10K 59/40;
                  H10K 77/111; H10K 59/12; H01L 25/18;
                       Y02E 10/549; G09F 9/301
    See application file for complete search history.

(56)              References Cited

FOREIGN PATENT DOCUMENTS

| | | | | | |
|---|---|---|---|---|---|
| CN | 111933611 | A | | 11/2020 | |
| CN | 112634764 | A | | 4/2021 | |
| CN | 112750883 | A | | 5/2021 | |
| CN | 112820208 | A | * | 5/2021 | .............. G09F 9/33 |
| CN | 112991945 | A | | 6/2021 | |
| CN | 113948004 | A | | 1/2022 | |
| CN | 114023905 | A | | 2/2022 | |
| CN | 115083287 | A | | 9/2022 | |
| KR | 20190105682 | A | * | 9/2019 | ......... H01L 51/5237 |
| KR | 20200000510 | A | * | 1/2020 | ............. H05K 1/148 |
| KR | 20200007115 | A | * | 1/2020 | .......... H04M 1/0266 |
| KR | 20200102025 | A | * | 8/2020 | ....... H10K 59/80516 |

OTHER PUBLICATIONS

Written Opinion of the International Search Authority in International application No. PCT/CN2021/136813,mailed on May 25, 2022.
Chinese Office Action issued in corresponding Chinese Patent Application No. 202210806079.1 dated Mar. 29, 2023, pp. 1-7.

* cited by examiner

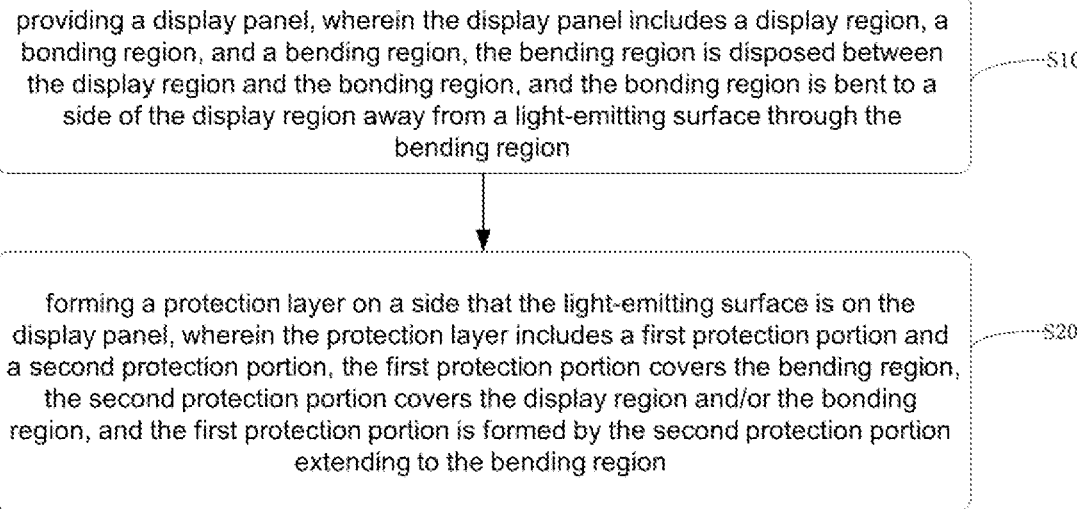

providing a display panel, wherein the display panel includes a display region, a bonding region, and a bending region, the bending region is disposed between the display region and the bonding region, and the bonding region is bent to a side of the display region away from a light-emitting surface through the bending region — S10 forming a protection layer on a side that the light-emitting surface is on the display panel, wherein the protection layer includes a first protection portion and a second protection portion, the first protection portion covers the bending region, the second protection portion covers the display region and/or the bonding region, and the first protection portion is formed by the second protection portion extending to the bending region — S20

FIG. 7

DISPLAY MODULE AND DISPLAY DEVICE

FIELD OF DISCLOSURE

The present disclosure relates to the field of display technology, and more particularly, to a display module and a display device.

BACKGROUND OF DISCLOSURE

With development of more advanced manufacturing equipment and material engineering technology, bendable, foldable, and curved display devices show more and more extensive application prospects, and their main advantage lies in their foldability, thereby achieving product diversity, and can achieve excellent display effect and appearance effect.

Currently, more common flexible display application solution is to bend a product at a bonding end of the display panel, and bend the bonding end to a back of the display panel, so as to reduce a frame region of the display panel and increase a proportion of effective display region of the display panel. Since a plurality of signal lines in the bending region are relatively fragile, in order to prevent the plurality of signal lines from breaking, ultraviolet (UV) glue is usually adopted to cover the bending region to reduce stress on the plurality of signal lines. However, the UV glue usually needs to be prepared through a dispensing process, which requires an additional process, resulting in an increase in cost.

SUMMARY

The present application provides a display module and a display device so as to solve a problem of a conventional display module and a conventional display device being required with an additional process of UV glue, when arranging the UV glue at a bending region to protect a signal line at the bending region.

In order to solve the above-mentioned problems, the present application provides technical solutions as follows:

The present application provides a display module including:

a display panel including a display region, a bonding region, and a bending region, wherein the bending region is arranged between the display region and the bonding region, and the bonding region is bent to a side of the display region away from a light-emitting surface through the bending region; and a protective layer disposed on the display panel, wherein the protective layer includes a first protection portion and a second protection portion, the first protection portion covers the bending region, the second protection portion covers the display region and/or the bonding region, and the first protection portion is formed by the second protection portion extending to the bending region.

According to the display module provided by the present application, the display module further includes a driving chip, wherein the driving chip is disposed on the display panel and located in the bonding region; and the second protection portion includes a first protection sub-portion, the first protection sub-portion covers the bonding region and is disposed away from the driving chip, and the first protection portion is formed by the first protection sub-portion extending to the bending region.

According to the display module provided by the present application, the display module further includes a color filter layer, wherein the color filter layer is disposed on a side that the light-emitting surface is on the display panel and is located in the display region;

wherein the second protection portion includes a second protection sub-portion, the second protection sub-portion covers a side of the color filter layer away from the display panel and covers the display region, and the first protection portion is formed by the second protection sub-portion extending to the bending region.

According to the display module provided by the present application, a thickness of the second protection sub-portion and a thickness of the first protection portion are equal.

According to the display module provided by the present application, a thickness of the second protection sub-portion is less than a thickness of the first protection portion.

According to the display module provided by the present application, the display module further includes an adhesive layer disposed on a side of the second protection sub-portion away from the display panel; and a cover plate disposed on a side of the adhesive layer away from the display panel;

wherein, within in the display region, the display panel includes:

a substrate;

a thin-film transistor array layer disposed on a side of the substrate adjacent to the light-emitting surface;

a light-emitting layer disposed on a side of the thin-film transistor array layer away from the substrate and located in the display region;

an encapsulation layer covering a side of the light-emitting layer away from the substrate; and a touch layer disposed on a side of the encapsulation layer away from the substrate;

wherein the color filter layer is disposed on a side of the touch layer away from the substrate.

According to the display module provided by the present application, the first protection portion is located on a side that the light-emitting surface is on the display panel.

According to the display module provided by the present application, the bending region includes:

a substrate;

a signal line arranged on a side of the substrate; and an inorganic layer covering a side of the signal line away from the substrate;

wherein the first protection portion is disposed on a side of the inorganic layer away from the substrate.

According to the display module provided by the present application, a thickness of the first protection portion ranges from 50 micrometers to 150 micrometers.

According to the display module provided by the present application, a material of the protective layer includes polyethylene terephthalate.

The present application provides a display device including the display module, the display module including:

a display panel including a display region, a bonding region, and a bending region, wherein the bending region is arranged between the display region and the bonding region, and the bonding region is bent to a side of the display region away from a light-emitting surface through the bending region; and a protective layer disposed on the display panel, wherein the protective layer includes a first protection portion and a second protection portion, the first protection portion covers the bending region, the second protection portion covers the display region and/or the bonding region, and the first protection portion is formed by the second protection portion extending to the bending region.

Beneficial effects of the present application are: in the display module and the display device provided by the present application, the protection layer is arranged on the display panel, the protection layer includes the first protection portion and the second protection portion, the first protection portion covers the bending region, the second protection portion covers the display region and/or the bonding region, and the first protection portion is formed by the second protection portion extending to the bending region. The first protection portion in the present application is adopted to replace the UV glue in the prior art, and can be formed by a same process with the second protection portion, which can reduce the manufacturing processes and reducing the production cost, while protecting the lines in the bending region. The first protection portion and the second protection portion do not need to be prepared by a dispensing process, so that, so that there is no risk of glue overflowing into the display region, which facilitates increasing the preparation accuracy.

BRIEF DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

FIG. 7 is a flowchart of a manufacturing method of a display module provided by an embodiment of the present application.

REFERENCE NUMERAL

101: display panel; AA: display region; BB: bonding region; AB: bending region; 102: protection layer; 1021: first protection portion; 1022: second protection portion; 1022a: first protection sub-portion; 1022b: second protection sub-portion; 103: reinforcing plate; 104: polarizer; 105: adhesive layer; 106: color filter layer; 107: cover plate; 108: driving chip; 109: flexible circuit board; 110: first backboard; 111: second backboard; 112: foam layer; 113: support layer; 114: buffer layer; 1011: substrate; 1012: thin-film transistor array layer; 1013: light-emitting layer; 1014: encapsulation layer; 1015: touch layer.

DETAILED DESCRIPTION OF PRESENT EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application. In addition, it should be understood that specific implementations described here are only used to illustrate and explain the present application and are not used to limit the present application. In the present application, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device.

Figure 1:
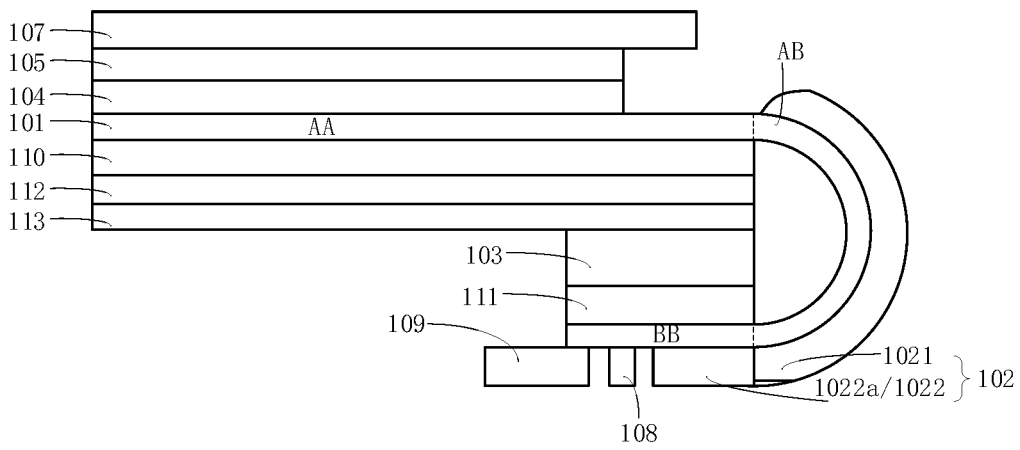
FIG. 1 is a cross-sectional structural schematic view of a first type of display module provided by an embodiment of the present application.
Figure 2:
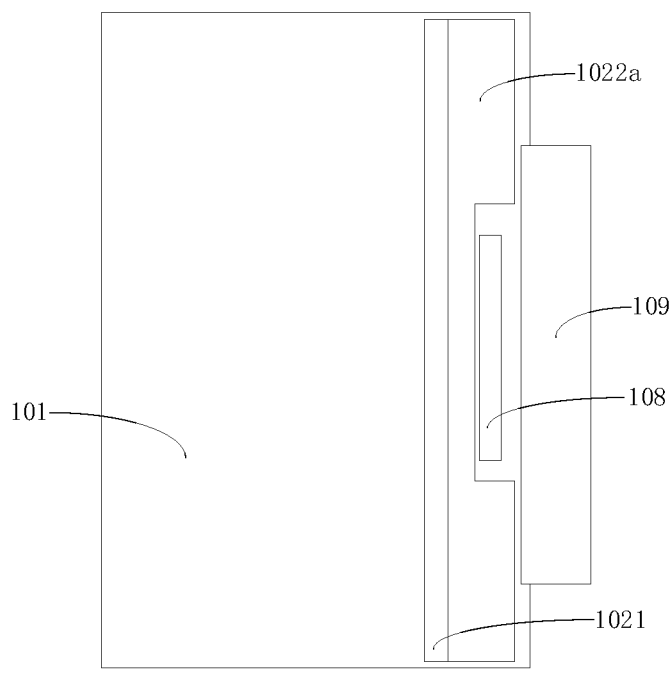
FIG. 2 is a planar structural schematic view of the display module provided by FIG. 1 before bending.

Referring to FIG. 1 and FIG. 2, FIG. 1 is a cross-sectional structural schematic view of a first type of display module provided by an embodiment of the present application, and FIG. 2 is a planar structural schematic view of the display module provided by FIG. 1 before bending. An embodiment of the present application provides a display module, and the display module includes a display panel 101 and a protection layer 102.

The display panel 101 is a flexible display panel, and the display panel 101 can be an organic light-emitting diode display panel. The display panel 101 includes a display region AA, a bonding region BB, and a bending region AB. The bending region AB is disposed between the display region AA and the bonding region BB, the display region AA and the bonding region BB are arranged opposite to each other, and the bonding region BB is bent to a side of the display region AA away from a light-emitting surface through the bending region AB, so that a lower frame of the display module can be reduced. The display region AA is configured for achieving screen display, and the bonding region BB is configured to bind external circuits such as a driving chip 108 and a flexible circuit board 109.

The protection layer 102 is disposed on the display panel 101. The protection layer 102 includes a first protection portion 1021 and a second protection portion 1022. The first protection portion 1021 covers the bending region AB, and the second protection portion 1022 covers the display region AA and/or the bonding region BB, and the first protection portion 1021 is formed by the second protection portion 1022 extending to the bending region AB.

It can be understood that the first protection portion 1021 in the present application is adopted to replace UV glue in the prior art, the first protection portion 1021 can be formed by a same process with the second protection portion 1022, and can protect wiring of the bending region AB, while reducing manufacturing processes and reducing production cost. The first protection portion 1021 and the second protection portion 1022 do not need to be prepared by a dispensing process, so that there is no risk of glue overflowing into the display region AA, which facilitates increasing a preparation accuracy.

In an embodiment of the present application, a material of the protection layer 102 includes polyethylene terephthalate (PET), i.e., the first protection portion 1021 is made of PET material. Since the PET material and the UV glue are similar, and are both flexible materials, the first protection portion 1021 can be bent together with the display panel 101 located in the bending region AB, which is not easily broken, and can be adopted to replace the UV glue arranged in the bending region AB in the prior art.

The bending region AB is provided with a plurality of signal lines, and the plurality of signal lines extend from the display region AA to the bending region AB, and are bent in a same direction along with the bending region AB. Since the plurality of signal lines are metal lines, they are likely to break when being bent. In the present application, the first protection portion 1021 covers the plurality of signal lines. On one hand, a rigidity of the bending region AB can be enhanced to prevent the bending region AB from being easily deformed when the display panel 101 is subjected to external forces, such as extrusion, so as to better protect the plurality of signal lines; on the other hand, the first protection portion 1021 has a certain thickness, which can adjust a neutral layer of the display panel 101 to the plurality of signal lines, so as to reduce a force on the plurality of signal lines and reduce a risk of the plurality of signal lines breaking.

Specifically, a thickness of the first protection portion 1021 ranges from 50 micrometers to 150 micrometers to meet protection requirements of the bending region AB. Certainly, those skilled in the art can also select an appropriate thickness of the first protection portion 1021 according to a size and a type of the display panel 101, a bending radius of the bending region AB, and stress relieving ability of the protection layer 102.

Specifically, an elastic modulus of the first protection portion 1021 ranges from 50 MPa to 500 MPa, so as to meet bending requirements of the first protection portion 1021.

The driving chip 108 and the flexible circuit board 109 are disposed in the bonding region BB, which can reduce a width of the lower frame of the display module, which facilitates achieving a narrow frame. The flexible circuit board 109 achieves driving of the display panel 101 through bonding with the driving chip 108. Specifically, an output end of the flexible circuit board 109 is electrically connected to an input end of the driving chip 108, and an output end of the driving chip 108 is electrically connected to the plurality of signal lines, so as to transmit driving signals to a plurality of pixel driving circuits located in the display region AA through the plurality of signal lines.

Furthermore, the second protection portion 1022 includes a first protection sub-portion 1022a, the first protection sub-portion 1022a covers the bonding region BB and is disposed away from the driving chip 108, and the first protection portion 1021 is formed by the first protection sub-portion 1022a extending to the bending region AB, and is configured to increase a stiffness of the bonding region BB.

It can be understood that both the first protection sub-portion 1022a and the first protection portion 1021 belong to the protection layer 102, i.e., the first protection sub-portion 1022a and the first protection portion 1021 adopt a same type of material. Specifically, a material of the first protection sub-portion 1022a and a material of the first protection portion 1021 are both PET materials. The first protection sub-portion 1022a and the first protection portion 1021 can be formed by a same process. An integrated design of the protection sub-portion 1022a and the first protection portion 1021 facilitates reducing manufacturing process and reducing cost.

The display module further includes a polarizer 104. The polarizer 104 is disposed on a side of the protection layer 102 away from the display panel 101 and is located in the display region AA. The polarizer 104 scatters light emitted from the display panel 101 to increase a viewing angle of the display panel 101.

Figure 3:
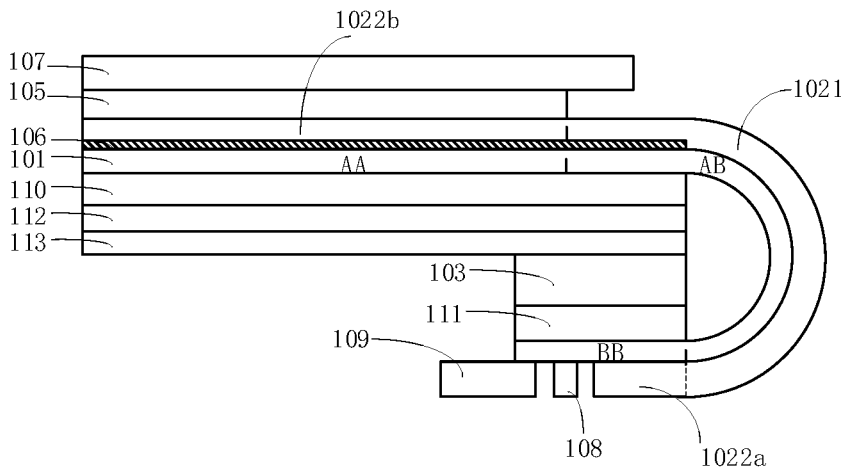
FIG. 3 is a cross-sectional structural schematic view of a second type of display module provided by an embodiment of the present application.
Figure 4:
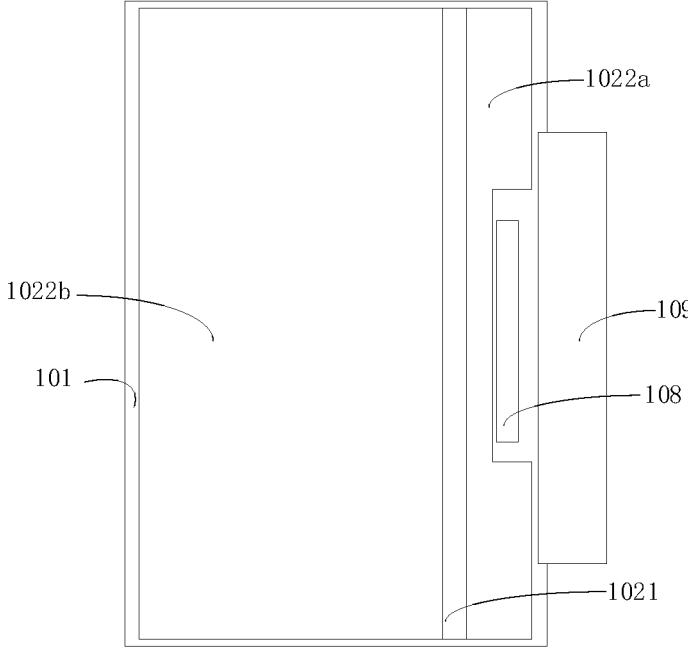
FIG. 4 is a planar structural schematic view of the display module provided by FIG. 3 before bending.

In an embodiment, referring to FIG. 3 and FIG. 4, FIG. 3 is a cross-sectional structural schematic view of a second type of display module provided by an embodiment of the present application, and FIG. 4 is a planar structural schematic view of the display module provided by FIG. 3 before bending. Differences between FIG. 3 and FIG. 1, and differences between FIG. 4 and FIG. 2 are that the display module includes a color filter layer 106. The color filter layer 106 is arranged on a side that the light-emitting surface is on the display panel 101 and is located in the display region AA. In this embodiment, the polarizer 104 is not provided, but the color filter layer 106 is adopted instead of the polarizer 104, which can not only be able to reduce a reflectivity of the display panel 101 under a certain extent of strong light, but also increase light-emitting rate of the display panel 101. A thickness of the color filter layer 106 is much less than a thickness of the polarizer 104 and has high flexibility, which can reduce an overall thickness of the display module and facilitates a development of dynamic bending products.

Specifically, the color filter layer 106 includes a plurality of color resists and a black matrix disposed between different color resists. The plurality of color resists include red color resists, green color resists, and blue color resists. The plurality of red color resists are arranged corresponding to a plurality of red sub-pixel units, and the plurality of red color resists is responsible for light-emitting of the plurality of red sub-pixel units. The plurality of green color resists are arranged corresponding to a plurality of green sub-pixel units, and the plurality of green color resists is responsible for light-emitting of the plurality of green sub-pixel units. The plurality of blue color resists are arranged corresponding to a plurality of blue sub-pixel units, and the plurality of blue color resists is responsible for light-emitting of the plurality of blue sub-pixel units. The black matrix is mainly responsible for preventing light leakage of the display module and reducing a reflectivity of the display module.

In order to protect the color filter layer 106, the second protection portion 1022 in this embodiment further includes a second protection sub-portion 1022b, and the second protection sub-portion 1022b covers a side of the color filter layer 106 away from the display panel 101 and is configured to protect the color filter layer 106 and serves purposes of waterproof and anti-oxidation. In an embodiment of the present application, the first protection portion 1021 is formed by the second protection sub-portion 1022b extending to the bending region AB.

It can be understood that, in this embodiment, both the second protection sub-portion 1022b and the first protection portion 1021 belong to the protection layer 102, i.e., the second protection sub-portion 1022b and the first protection sub-portion 1022a are made of a same material. Specifically, materials of the second protection sub-portion 1022b, the first protection sub-portion 1022a, and the first protection portion 1021 are PET materials, and the second protection sub-portion 1022b and the first protection portion 1021 are formed by a same process. An integrated design of the second protection sub-portion 1022b and the first protection portion 1021 facilitates reducing the manufacturing process and reducing the cost.

Furthermore, the second protection sub-portion 1022b, the first protection sub-portion 1022a, and the first protection portion 1021 all belong to the protection layer 102, i.e., the second protection sub-portion 1022b, the first protection sub-portion 1022*a*, and the first protection portion 1021 are made of a same material. Specifically, materials of the second protection sub-portion 1022*b*, the first protection sub-portion 1022*a*, and the first protection portion 1021 are PET materials. The second protection sub-portion 1022*b*, the first protection sub-portion 1022*a*, and the first protection portion 1021 are formed by a same process. An integrated design of the second protection sub-portion 1022*b*, the first protection portion 1021, and the first protection portion 1021 facilitates reducing the manufacturing process and reducing the cost.

In an embodiment, a thickness of the second protection sub-portion 1022*b* is equal to a thickness of the first protection portion 1021, which facilitates preparation of the protection layer 102 and does not require an additional process.

In another embodiment, the thickness of the second protection sub-portion 1022*b* is less than the thickness of the first protection portion 1021, so that a side surface of the first protection portion 1021 away from the display panel 101 and a side surface of the second protection sub-portion 1022*b* away from the display panel 101 are located on a same surface. That is to say, a surface of a portion of the protection layer 102 located in the display region AA and a portion of the protection layer 102 located in the bending region AB are uniform, which facilitates reducing a stress of the protection layer 102 at an interface between the display region AA and the bending region AB.

Specifically, the thickness of the first protection portion 1021 ranges from 50 micrometers to 150 micrometers, and the thickness of the color filter layer 106 is less than 3 micrometers.

Figure 5:
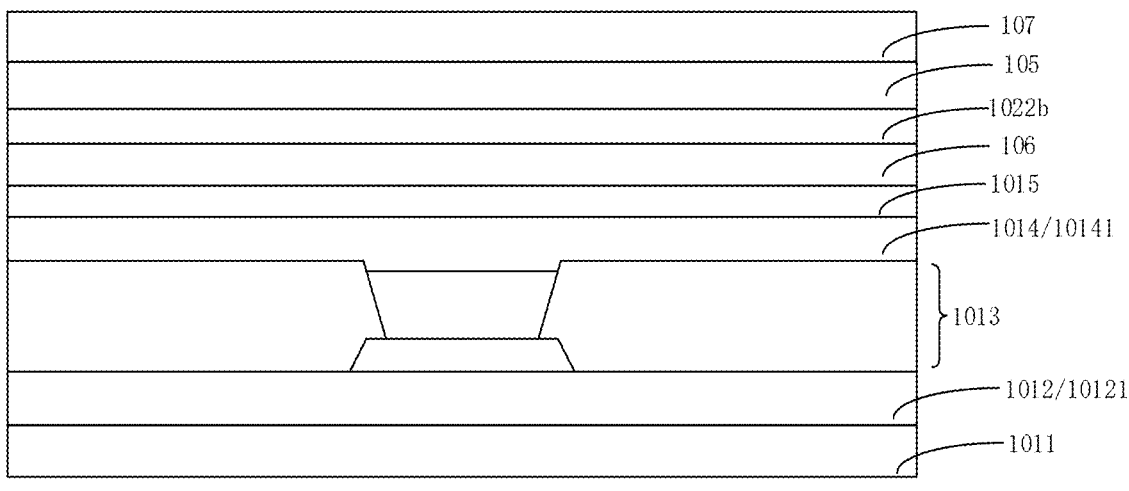
FIG. 5 is a partial cross-sectional structural schematic view of a display region of the display module provided by FIG. 3.

Referring to FIG. 5, FIG. 5 is a partial cross-sectional structural schematic view of a display region of the display module provided by FIG. 3. The display panel 101 includes a substrate 1011 and a thin-film transistor array layer 1012 disposed on a side of the substrate 1011 adjacent to the protection layer 102. The thin-film transistor array layer 1012 includes a plurality of thin-film transistors and a plurality of the signal lines 10121. The plurality of thin-film transistors are located in the display region AA, and are configured for driving a plurality of pixels located in the display region AA to emit light.

The display panel 101 further includes a light-emitting layer 1013, an encapsulation layer 1014, and a touch layer 1015. The light-emitting layer 1013 is disposed on a side of the thin-film transistor array layer 1012 away from the substrate 1011 and is located in the display region AA, the encapsulation layer 1014 covers a side of the light-emitting layer 1013 away from the substrate 1011 and is located in the display region AA, and the touch layer 1015 is disposed on a side of the encapsulation layer 1014 away from the substrate 1011 and is located in the display region AA, and the color filter layer 106 is disposed on a side of the touch layer 1015 away from the substrate 1011. The touch layer 1015 can be a direct cell touch (DOT) layer on a screen.

Furthermore, the display module further includes an adhesive layer 105 and a cover plate 107, the adhesive layer 105 is disposed on a side of the second protection sub-portion 1022*b* away from the display panel 101, and the cover board 107 is disposed on a side of the adhesive layer 105 away from the display panel 101. The cover plate 107 is a transparent cover plate. The polarizer 104, the color filter layer 106, the touch layer 1015, and the cover plate 107 are not bent along with the display panel 101. The adhesive layer 105 can be optical glue. It should be noted that, in some embodiments, a planarization layer can also be formed on the color filter layer 106 to planarize the color filter layer 106.

In the present application, the first protection portion 1021 is located on the side that the light-emitting surface is on the display panel 101. Specifically, the bending region AB includes the substrate 1011, the plurality of signal lines and an inorganic layer. The plurality of signal lines are arranged on a side of the substrate 1011, the inorganic layer covers a side of the plurality of signal lines away from the substrate 1011, and the first protection portion 1021 is configured to protect the plurality of signal lines, which serves a purpose as that of the UV glue in the prior art. The first protection portion 1021 is disposed on a side of the inorganic layer away from the substrate 1011. It can be understood that the inorganic layer 10141 includes an inorganic film layer in the encapsulation layer 1014. Taking the encapsulation layer 1014 including a first inorganic encapsulation layer, an organic encapsulation layer, and a second inorganic encapsulation layer arranged in layers as an example, the inorganic layer includes the first inorganic encapsulation layer and the second inorganic encapsulation layer extending from the display region AA to the bending region AB.

In one embodiment, reference is further made to FIG. 3, the display module can be a dynamic bending module. Specifically, the display module further includes a first backboard 110 and a second backboard 111 that are oppositely disposed, the first backboard 110 is disposed on the side of the display region AA away from the light-emitting surface, and the second backboard 111 is disposed on a side of the bonding region BB adjacent to the light-emitting surface. The first backboard 110 is configured to support and protect the display region AA, which can ensure planarizing of a surface of the display region AA and flatness of the surface in subsequent manufacturing process. The second backboard 111 is configured for supporting and protecting the bonding region BB, which can ensure firmness of the bonding between the driving chip 108 and the display panel 101.

It should be noted that an embodiment of the present application are not limited to types of material of the first backboard 110 and the second backboard 111, any type of material that can support a support substrate is within a protection scope of the present application.

Furthermore, a foam layer 112 is further provided on a side of the first backboard 110 adjacent to the second backboard 111, and a support layer 113 is provided on a side of the foam layer 112 adjacent to the second backboard 111. A material of the support layer 113 can be stainless steel, so as to enhance supporting strength of the second backboard 111. A reinforcing plate 103 is further disposed between the support layer 113 and the second backboard 111, and the reinforcing plate 103 is configured to enhance a strength of the display panel 101. The reinforcing plate 103 can be a polyimide layer or a graphite layer, wherein an outer surface of the graphite layer can also be coated with polyimide, which is not specifically limited in embodiments of the present application.

Figure 6:
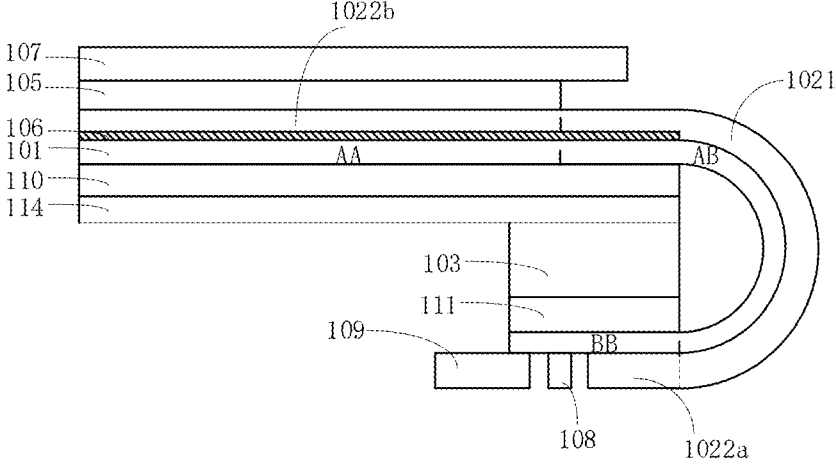
FIG. 6 is a cross-sectional structural schematic view of a third type of display module provided by an embodiment of the present application.

In an embodiment, referring to FIG. 6, FIG. 6 is a cross-sectional structural schematic view of a third type of display module provided by an embodiment of the present application. Differences between FIG. 6 and FIG. 3 are that the display module can also be a static bending module. Specifically, a buffer layer 114 is provided on a side of the first backboard 110 adjacent to the second backboard 111. The buffer layer 114 is a laminated structure of a foam layer, a copper foil layer, and a graphite layer, and the reinforcing plate 103 is arranged between the first backboard 110 and the second backboard 111.

Referring to FIG. 7. FIG. 7 is a flowchart of a manufacturing method of a display module provided by an embodiment of the present application. An embodiment of the present application also provides a manufacturing method of a display module, which includes the following steps:

Step S10: providing a display panel 101, wherein the display panel 101 includes a display region AA, a bonding region BB, and a bending region AB, the bending region AB is disposed between the display region AA and the bonding region BB, and the bonding region BB is bent to a side of the display region AA away from a light-emitting surface through the bending region AB;

Step S20: forming a protection layer 102 on a side that the light-emitting surface is on the display panel 101, wherein the protection layer 102 includes a first protection portion 1021 and a second protection portion 1022, the first protection portion 1021 covers the bending region AB, the second protection portion 1022 covers the display region AA and/or the bonding region BB, and the first protection portion 1021 is formed by the second protection portion 1022 extending to the bending region AB.

It can be understood that, a material of the protection layer 102 includes polyethylene terephthalate. Therefore, the first protection portion 1021 can be formed by a yellow light process or a curing process, compared to a material of the first protection portion 1021 being UV glue in the prior art, since the first protection portion 1021 in the present application does not need to be prepared by a glue dispensing process, there is no risk of glue overflowing into the display region AA, which facilitates increasing a preparation accuracy.

Furthermore, the step S20 further includes:

forming a first protection sub-portion 1022*a* in the bonding region BB, wherein the first protection portion 1021 is formed by the first protection sub-portion 1022*a* extending to the bending region AB.

Furthermore, before forming the protection layer 102, the manufacturing method further includes:

forming a color filter layer 106 on a side of the light-emitting surface of the display panel 101, wherein the color filter layer 106 is located in the display region AA.

Specifically, the color filter layer 106 includes a plurality of color resists and a black matrix disposed between different color resists. The black matrix can be formed by a yellow light process, and the plurality of color resists can be formed by a yellow light process or inkjet printing process.

The step of forming the protection layer 102 further includes:

forming a second protection sub-portion 1022*b* on a side of the color filter layer 106 away from the display panel 101, wherein the first protection portion 1021 is formed by the second protection sub-portion 1022*b* extending to the bending region AB.

An embodiment of the present application further provides a display device, the display device includes the display module in the above-mentioned embodiments, and the display device can be any product or component with a display function such as a mobile phone, a tablet computer, a TV, a monitor, a notebook computer, a digital photo frame, or a navigator.

Beneficial effects of the present application are: in the display module and the display device provided by embodiments of the present application, the protection layer is arranged on the display panel, the protection layer includes the first protection portion and the second protection portion, the first protection portion covers the bending region, the second protection portion covers the display region and/or the bonding region, and the first protection portion is formed by the second protection portion extending to the bending region. The first protection portion in the present application is adopted to replace the UV glue in the prior art, and can be formed by a same process with the second protection portion, which can reduce the manufacturing processes and reducing the production cost, while protecting the lines in the bending region. The first protection portion and the second protection portion do not need to be prepared by a dispensing process, so that, so that there is no risk of glue overflowing into the display region, which facilitates increasing the preparation accuracy.

Although the present application has been disclosed above with the preferred embodiments, it is not intended to limit the present application. Persons having ordinary skill in this technical field can still make various alterations and modifications without departing from the scope and spirit of this application. Therefore, the scope of the present application should be defined and protected by the following claims and their equivalents.

What is claimed is:

1. A display module, comprising:

a display panel comprising a display region, a bonding region, and a bending region, wherein the bending region is arranged between the display region and the bonding region, and the bonding region is bent to a side of the display region away from a light-emitting surface through the bending region; and a protective layer disposed on the display panel, wherein the protective layer comprises a first protection portion and a second protection portion, the first protection portion covering the bending region, the second protection portion covering the display region and the bonding region, and the first protection portion being formed by the second protection portion extending to the bending region;

wherein the display module further comprises a color filter layer disposed in the display region on a side of the display panel facing the light-emitting surface;

wherein the second protection portion comprises a first protection sub-portion and a second protection sub-portion, the first protection sub-portion covering the bonding region, the second protection sub-portion covering the display region and a side of the color filter layer farthest from the display panel, and the first protection portion being formed by the first protection sub-portion and the second protection sub-portion extending toward the bending region; and wherein the second protection sub-portion comprises an inward recess on a side facing the display panel, the recess engaging the color filter layer, and a side surface of the second protection sub-portion farthest from the display panel is coplanar with a side surface of the first protection portion farthest from the display panel.

2. The display module according to claim 1 further comprising a driving chip, wherein the driving chip is disposed on the display panel and located in the bonding region; and the first protection sub-portion is arranged not to overlap the driving chip.

3. The display module according to claim 1, wherein a thickness of the second protection sub-portion and a thickness of the first protection portion are equal.

4. The display module according to claim 1, wherein a thickness of the second protection sub-portion is less than a thickness of the first protection portion.

5. The display module according to claim 1, further comprising:

an adhesive layer disposed on a side of the second protection sub-portion farthest from the display panel; and a cover plate disposed on a side of the adhesive layer farthest from the display panel;

wherein, within in the display region, the display panel comprises:

a substrate;

a thin-film transistor array layer disposed on a side of the substrate adjacent to the light-emitting surface;

a light-emitting layer disposed on a side of the thin-film transistor array layer farthest from the substrate and located in the display region;

an encapsulation layer covering a side of the light-emitting layer farthest from the substrate; and a touch layer disposed on a side of the encapsulation layer farthest from the substrate;

wherein the color filter layer is disposed on a side of the touch layer farthest from the substrate.

6. The display module according to claim 1, wherein the first protection portion is located on a side that the light-emitting surface is on the display panel.

7. The display module according to claim 6, wherein the bending region comprises:

a substrate;

a signal line arranged on a side of the substrate; and an inorganic layer covering a side of the signal line farthest from the substrate;

wherein the first protection portion is disposed on a side of the inorganic layer farthest from the substrate.

8. The display module according to claim 1, wherein a material of the protective layer comprises polyethylene terephthalate.

9. A display module, comprising:

a display panel comprising a display region, a bonding region, and a bending region, wherein the bending region is arranged between the display region and the bonding region, and the bonding region is bent to a side of the display region away from a light-emitting surface through the bending region; and a protective layer disposed on the display panel, wherein the protective layer comprises a first protection portion and a second protection portion, the first protection portion covering the bending region, the second protection portion covering the bonding region but not the display region, and the first protection portion being formed by the second protection portion extending to the bending region.

10. The display module according to claim 9 further comprising a driving chip, wherein the driving chip is disposed on the display panel and located in the bonding region; and the second protection portion comprises a first protection sub-portion, the first protection sub-portion covering the bonding region and being arranged not to overlap the driving chip, and the first protection portion being formed by the first protection sub-portion extending to the bending region.

11. The display module according to claim 9, wherein, within in the display region, the display panel comprises:

a substrate;

a thin-film transistor array layer disposed on a side of the substrate adjacent to the light-emitting surface;

a light-emitting layer disposed on a side of the thin-film transistor array layer farthest from the substrate and located in the display region;

an encapsulation layer covering a side of the light-emitting layer farthest from the substrate; and a touch layer disposed on a side of the encapsulation layer farthest from the substrate.

12. The display module according to claim 9, wherein the first protection portion is located on a side that the light-emitting surface is on the display panel.

13. The display module according to claim 12, wherein the bending region comprises:

a substrate;

a signal line arranged on a side of the substrate; and an inorganic layer covering a side of the signal line farthest from the substrate;

wherein the first protection portion is disposed on a side of the inorganic layer farthest from the substrate.

14. The display module according to claim 13, wherein a thickness of the first protection portion ranges from 50 micrometers to 150 micrometers.

15. The display module according to claim 9, wherein a material of the protective layer comprises polyethylene terephthalate.

16. A display device, comprising a display module, the display module comprising:

a display panel comprising a display region, a bonding region, and a bending region, wherein the bending region is arranged between the display region and the bonding region, and the bonding region is bent to a side of the display region away from a light-emitting surface through the bending region; and a protective layer disposed on the display panel, wherein the protective layer comprises a first protection portion and a second protection portion, the first protection portion covering the bending region, the second protection portion covering the bonding region but not the display region, and the first protection portion being formed by the second protection portion extending to the bending region.

* * * * *